United States Patent [19]

McDaniel et al.

[11] Patent Number: 5,194,710
[45] Date of Patent: Mar. 16, 1993

[54] METHOD AND APPARATUS FOR LASER MASKING OF LEAD BONDING

[75] Inventors: Kent T. McDaniel, Eau Claire; David J. Johnson; Nicholas J. Krajewski, both of Chippewa Falls; David W. LeMay, Eau Claire, all of Wis.

[73] Assignee: Cray Research, Inc., Eagan, Minn.

[21] Appl. No.: 704,067

[22] Filed: May 22, 1991

[51] Int. Cl.⁵ ............................................. B23K 26/00
[52] U.S. Cl. ........................ 219/121.63; 219/121.64; 219/121.82
[58] Field of Search ............. 219/121.12, 121.13, 219/121.82, 121.63, 126.64

[56] References Cited

U.S. PATENT DOCUMENTS

| | | | |
|---|---|---|---|
| 4,379,219 | 4/1983 | Behrens et al. | 219/121.63 |
| 4,461,945 | 7/1984 | O'Cheskey et al. | 219/121.63 |
| 4,697,061 | 9/1987 | Spater et al. | 219/121.64 |
| 4,970,365 | 11/1990 | Chalco | 219/12.63 |

*Primary Examiner*—C. L. Albritton
*Attorney, Agent, or Firm*—Merchant, Gould, Smith, Edell, Welter & Schmidt

[57] ABSTRACT

An apparatus and method of making a beam of directed energy used to bond leads to bonding areas is disclosed. The masking tool preferably includes a groove adapted to allow the beam to strike the lead while masking the surrounding substrate to prevent damage to it. The tool preferably reflects the energy striking it away from the substrate. The method can include the use of an external heat source to provide heat to the bonding process or, in the alternative, provide heat sinking to protect the electrical components from heat damage. Alternate embodiments of the tool can include a plurality of grooves or slots to allow scanning of the beam in the bonding process.

33 Claims, 4 Drawing Sheets

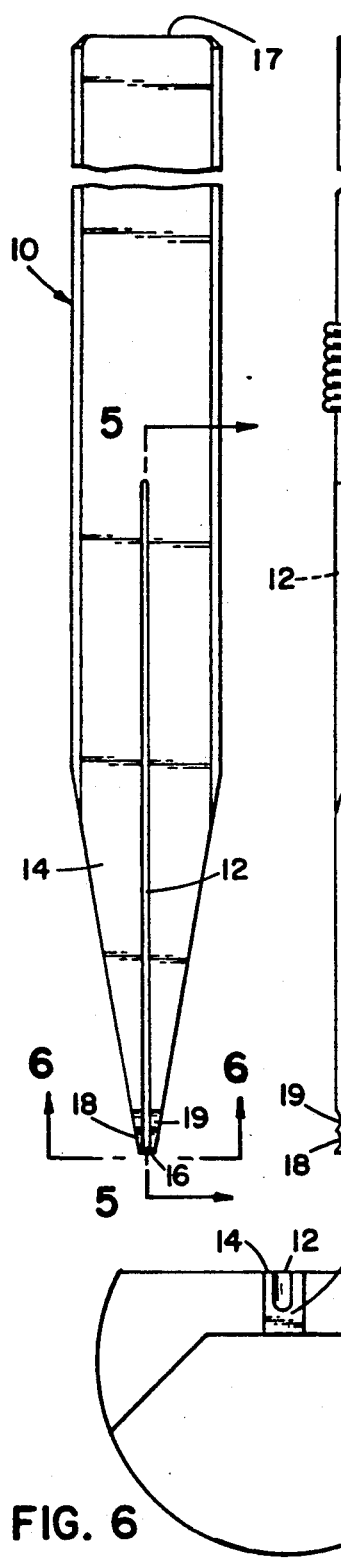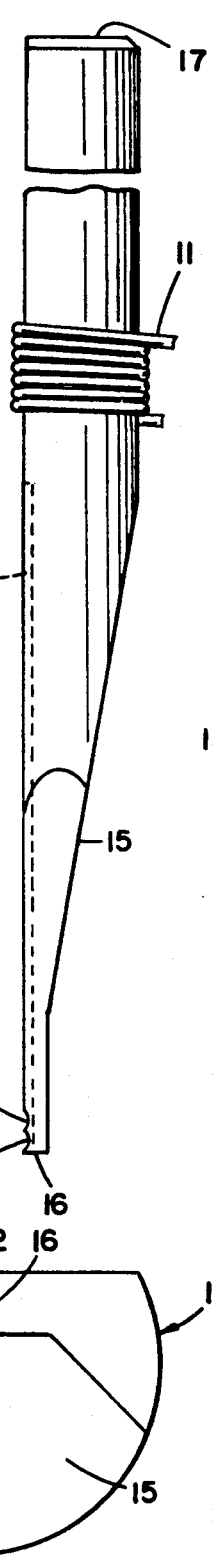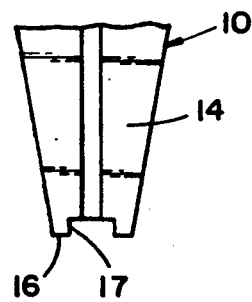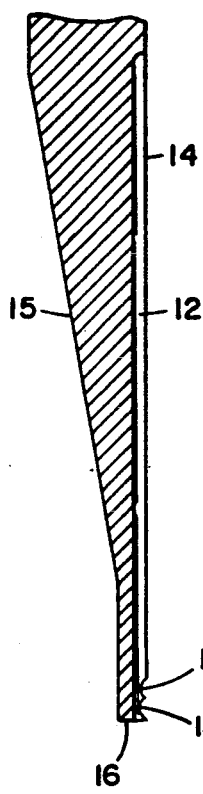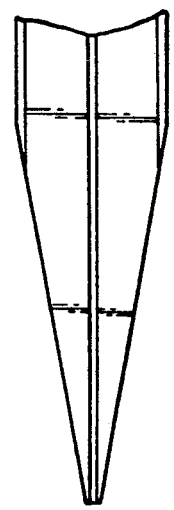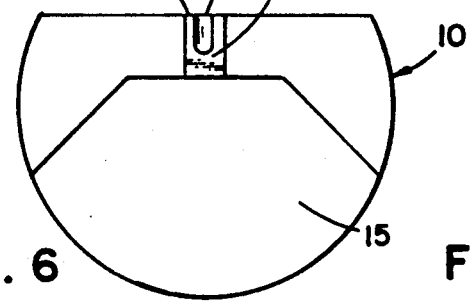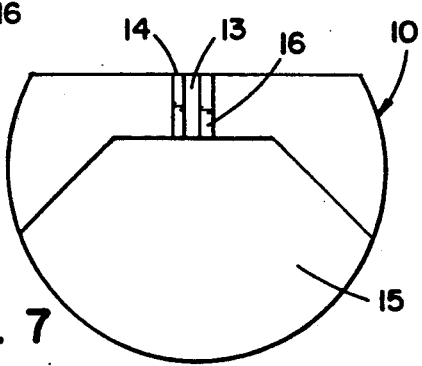

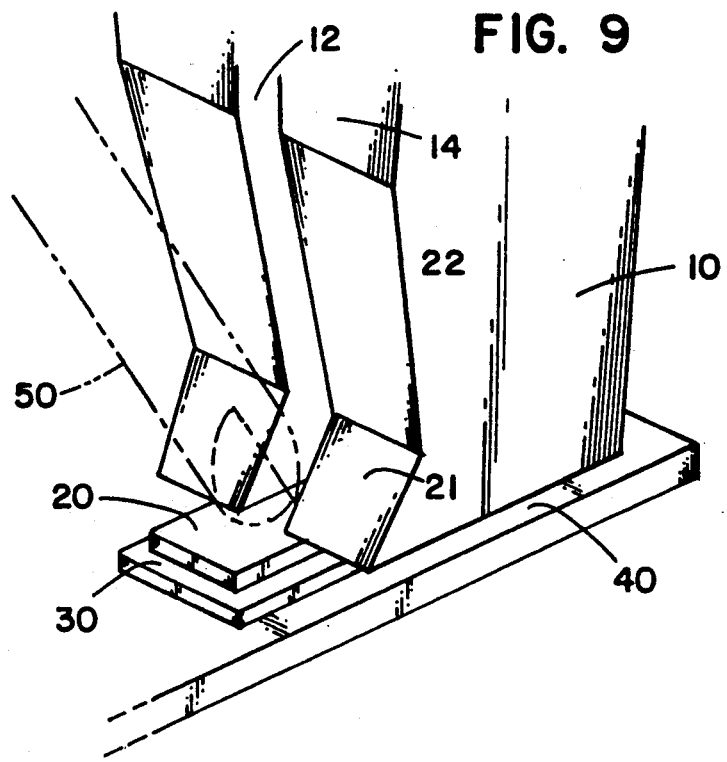
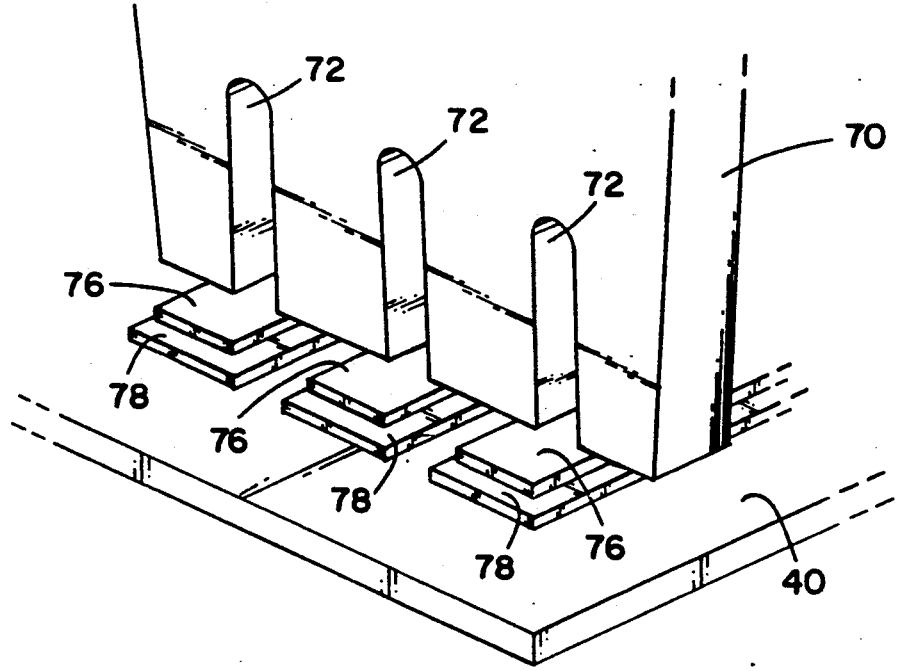

METHOD AND APPARATUS FOR LASER MASKING OF LEAD BONDING

TECHNICAL FIELD OF THE INVENTION

The present invention relates primarily to a method and apparatus for masking a beam of laser energy directed at the lead of an integrated circuit to bond the lead to a chosen substrate.

BACKGROUND OF THE INVENTION

The bonding of integrated circuit leads is a process requiring both control over physical placement of the integrated circuit leads as well as the laser energy directed at those leads to bond them. When a laser or other source of directed energy is used to supply the energy required to bond the leads to bonding pads or other sites, control over placement of the beam is critical to avoid damaging the integrated circuits substrates located around the bonding pads or other sites. Damage to the substrate of a circuit board or other electrical component can lead to failure of the circuit board or component.

The importance of accuracy or masking of the laser beam becomes apparent when the relative sizes of the leads, bonding surfaces and tools normally used in the bonding process are considered. The state of the art integrated circuit lead has a width of less than 0.004 inches while the tools used to hold down and bond leads to bonding surfaces are typically less than 0.008 inches wide.

Focusing of laser energy to reduce spot size also involves difficulties. Every attempt to focus a laser beam results in a spot with accompanying fringe energy outside the spot diameter. That fringe energy is intense enough outside the spot diameter to damage the substrate and, when combined with other focusing problems such as aiming of optics as well as X-Y translation table inaccuracies, substrate damage is very difficult to eliminate.

Prior attempts to use lasers and other forms of directed energy to bond leads and bonding surfaces have included the use of hollowed tools with the energy being directed down the center of the hollowed tool. Problems with that arrangement included tools that were too large to be useful in bonding smaller sized leads to bonding surfaces, fabrication difficulties due to the small hole diameter versus length of hole required, splattering of metal and other materials caused by heating of the leads and bonding surfaces within the hollowed tool, and thermal cascading of the bond tool. Splattering, in particular, reduces the effectiveness of the energy beam by coating the interior of the hollowed tool, narrowing the through-hole and blocking energy from reaching the lead. The small through-holes also absorb a large portion of the energy before splatter reduces their diameters. Thermal cascading of the bond tool results in bond strength variations, which are unacceptable for high volume processing.

The present invention provides a method and apparatus for masking a laser or other directed energy beam used in bonding leads while avoiding the problems faced with prior art devices. The present invention uses a modified standard tool which allows standard lead bonding equipment to be used in conjunction with a laser or other energy source and the modified tool. That results in additional reliability and dependability because of the standard equipment used to bond the leads.

SUMMARY OF THE INVENTION

The present invention includes an apparatus and method of directing and masking a laser or other directed energy beam directed at an integrated circuit lead to bond outer leads to the bonding pads of a circuit board, inner lead bonding to components or flex circuit bonding. The apparatus preferably includes a groove and features formed in an exterior surface of the tool used to mask and direct the beam.

The preferred method of masking during laser bonding includes the steps of bringing the masking tool into contact with the lead, which, in turn, forces the lead into contact with a bonding surface. Once the lead is in place, the energy beam source, which is preferably an Nd-Yag laser, is fired into a groove in the masking tool. The resulting beam strikes both the masking tool and lead although its outer portions are limited to striking the masking tool face.

It is by directing the beam into the groove formed in the masking tool that the substrate is protected from receiving stray energy which could damage it, as well protecting it from damage if the beam is misdirected and fails to strike the lead or bonding surface. Although masking a portion of the beam reduces the amount of energy available for bonding, the masking tool groove size, beam power and dwell time can be adjusted to allow a sufficient amount of energy to strike the lead and bond it to the bonding surface. In addition, the tool can act as a heat source to supply heat to the lead and bonding surface.

In the preferred embodiment, the masking tool includes holding means for holding a lead against a bonding surface and masking means on an exterior surface of the holding means to mask the substrate from energy directed at the lead, energy which would otherwise strike the substrate instead of the lead or bonding surface and cause damage. The masking tool preferably has a width at its end which is substantially equal to or greater than the width of the bonding surface.

In addition, the masking tool could alternately include an alignment mechanism to align the leads under the masking tool and on the bonding surfaces. The alignment mechanism could be a notch proximate the midpoint of the masking tool end with the notch adapted to cooperate with the lead to align it proximate the midpoint of the end of the masking tool.

In the preferred embodiment, the masking means comprises a groove formed on the exterior surface of the masking tool, the groove originating from the end of the tool used to hold leads down and is adapted to allow sufficient energy to strike the lead while preventing the fringe and reflected energy from striking the substrate and causing damage thereon. The groove is preferably centered along a midpoint of the masking tool. In an alternate embodiment, the masking means could comprise a slot formed through the masking tool, which would operate essentially the same as a groove.

In the preferred embodiment, the masking means is adapted to reflect the directed energy striking it in a direction away from the substrate. Alternately, the masking means can be polished to reflect substantially all of the directed energy striking it in a randomly scattered manner. In another alternate embodiment, the masking means can be adapted to absorb substantially all of the directed energy striking the masking tool.

In the preferred embodiment, the masking tool is used to impart additional heat energy to the bonding area by channelling the absorbed incident laser energy or providing external heat energy imparted to the tool by a resistance or other type of heater. The use of externally supplied heat energy can reduce laser energy required by preheating the bonding area. Alternately the tool can function as a heat sink, drawing excess heat energy away from the lead and bonding surface to protect any electrical components connected to the lead or bonding surface from heat damage associated with the bonding process.

The preferred method of masking includes the steps of placing a lead on a bonding surface, holding the lead stationary and in contact with the bonding surface using a masking tool, directing energy at the lead from a laser or other source of directed energy to bond the lead to the bonding surface, masking the surrounding substrate from the energy directed at the lead and bonding surface with an exterior surface of the masking tool, and removing the masking tool from contact with the bonded lead and bonding surface.

In the preferred method, the directed energy is supplied by a Neodymium-Yttrium-Aluminum Oxide Garnet (Nd-Yag) laser. Alternative laser sources can be used, such as carbon dioxide, ruby, excimer and others.

An alternate preferred method could include the step of aligning the lead on the bonding surface using a notch formed in the end of the masking tool. The notch would cooperate with the lead to center it under the masking tool and, therefore, on the bonding surface.

In the preferred method, the masking is accomplished by directing the energy at a groove formed in an exterior surface of the masking tool, the groove adapted to cooperate with the directed energy beam to allow a sufficient amount of the energy to reach the lead to bond it with the bonding surface while masking the substrate from stray directed energy. In an alternate method, the masking can be accomplished by a slot formed through the masking tool which accomplishes the same purpose as the groove described above.

In the preferred method, the masking tool reflects the directed energy striking it away from the substrate in a controlled manner. In alternate embodiments of the method, the surface of the masking tool can be adapted to reflect, in a substantially random scattered manner, substantially all of the directed energy striking it, or to absorb substantially all of the energy.

Also in the preferred method, the masking tool acts as a heat source to add heat energy to the bonding surface, which can reduce the amount of laser energy required for bonding. Alternately, the masking tool can provide a heat sinking mechanism to remove heat from the bonding surface to protect electrical components which may be connected to the bonding surface from heat damage during the bonding process.

An alternate preferred method and apparatus includes a masking tool with the ability to mask a plurality of leads and bonding surfaces at the same time, which allows the beam to be scanned or moved from lead to lead which may speed the bonding process.

These and other various advantages and features of the invention's novelty are pointed out in the claims. However, for a more complete understanding of the invention and its advantages, reference should be made to the drawings forming a part hereof and to the accompanying description, in which there is illustrated and described preferred embodiments of the invention.

DESCRIPTION OF THE DRAWINGS

FIG. 3 is a side elevation of the preferred tool showing the preferred masking means;

FIG. 4 is a side elevation of the preferred embodiment of the tool;

FIG. 5 is a cross-section of the preferred tool along line 5—5 as shown in FIG. 3;

FIG. 6 is an end view of the preferred embodiment of the tool shown from perspective 6—6 as illustrated in FIG. 3;

FIG. 7 is an end view of an alternate embodiment of the tool;

FIG. 8 is an enlarged side elevation of the end of an alternate embodiment of the tool;

FIG. 9 is a perspective view of alternate preferred tool, lead and bonding pad with a beam of directed energy shown performing the bonding process;

FIG. 10 is a side elevation of a portion of an alternate preferred tool;

FIG. 11 is a perspective view of alternate preferred tool shown masking multiple leads and bonding pads;

DETAILED DESCRIPTION OF THE PREFERRED EMBODIMENTS

In the following detailed description of the preferred embodiments, reference is made to the accompanying drawings which form a part hereof, and in which is shown of by way of illustration specific embodiments in which the invention may be practiced. It is to be understood that other embodiments may be utilized and structural changes may be made without departing from the scope of the present invention.

In particular, although a tool and method of outer lead bonding of an integrated chip package to a circuit board is described in detail, it should be understood that the tool and method are also capable of inner lead bonding of integrated circuits as well as flex bonding applications, among others, and the invention should be limited in scope only by the claims attached hereto.

Preferred Masking Tool

Figure 1:
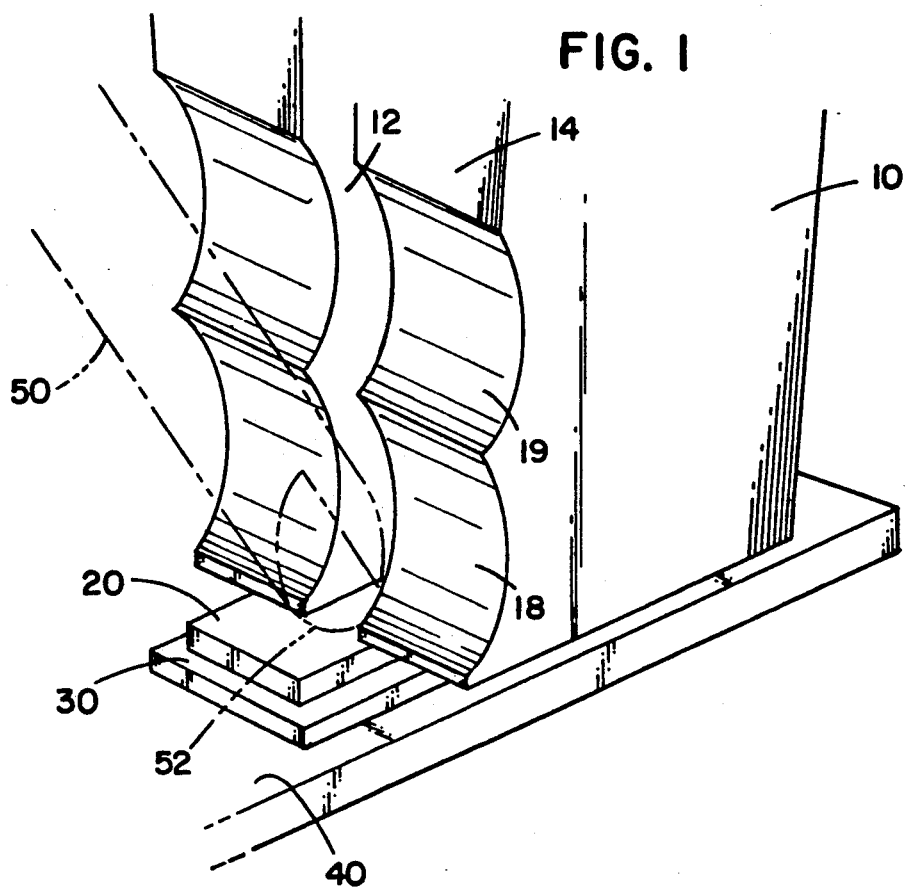
FIG. 1 is a perspective view of the preferred tool, lead and bonding pad with a beam of directed energy shown perform the bonding process.

The preferred embodiment of the present invention consists of a masking tool adapted to mask a laser beam used to bond an integrated circuit lead to the bonding pad of a circuit board. The masking is preferably performed by a groove formed in an exterior surface of the masking tool. FIG. 1 shows the preferred masking tool 10 in place on an integrated circuit lead 20 on a bonding pad 30 of a circuit board 40. Also shown is a beam of directed energy 50, which is preferably a laser beam produced by a Neodymium-Yttrium-Aluminum Oxide Garnet (Nd-Yag) laser.

The preferred masking tool 10 dimensions are based on a bonding process for bonding leads spaced on 0.004" centers. It will be understood that the dimensions can be altered as required, based on application (i.e., inner lead bonding, outer lead bonding, flex bonding, etc.), processing speed, lead size, lead composition, bonding pad composition, laser energy level, focusing parameters and many other variables.

The face 14 of the preferred embodiment of the masking tool 10 is shown in a side elevation in FIG. 3. In the preferred embodiment, the face 14 is constructed to reflect substantially all of the beam in a direction away from the board 40 or chip 60. To accomplish that purpose, the face 14 of the preferred embodiment includes depressions 18,19 formed in it as depicted in FIGS. 1 and 3-5. The depressions 18, 19 are substantially semi-circular and have a radius of approximately 0.005". The lower depression 18 is formed having its center located approximately 0.0065 inches from the end 16 of the tool 10. The upper depression 19 is formed with its center being located approximately 0.0115 inches from the bottom 16 of the tool 10. Both depressions 18, 19 are formed in the face 14 of the tool to a depth of approximately 0.003 inches. The surfaces within the depressions 18, 19 are preferably left in a matte finish that naturally results from the Electric Discharge Machining (EDM) process used to form the depressions. The remainder of the surface 14 can be polished or coated with a material or finished to a surface which would also substantially reflect the laser energy or would absorb the energy without reflections.

As seen in FIGS. 3-6, the groove 12 of the preferred embodiment is formed in the face portion 14 of the masking tool 10. Also seen in those views, the end 16 of the masking tool 10 is preferably tapered from the cross-section of the opposite end 17 of the masking tool. That tapering is necessary and desirable to allow bonding of closely-spaced leads to similarly spaced bonding pads. The masking tool 10 flares away from the end 16 to its full diameter and size. At end 17 in the preferred embodiment, the diameter of the tool is 0.0624 inches while the diameter perpendicular to the face side 14 is approximately 0.046 inches. The preferred overall length of the masking tool 10 from its tapered end 16 to the opposite end 17 is 0.75 inches. Other tool lengths and diameters can, however, be used as needed.

FIG. 4 also shows that the preferred embodiment has a tapered back portion 15 opposite the face side which is preferably tapered at an angle 10° off the longitudinal axis of the masking tool 10. Also shown in FIG. 4, the back 15 is tapered to a point approximately 0.045 inches from the end 16 of the tool 10. At that point, 0.045 inches from the end 16, the back side 15 of the tool 10 (opposite the face side 14) is preferably parallel to the face side 14. The tapered design allows the tool 10 to be used in close proximity with integrated circuit chips, leads, and bonding pads.

The cross-section shown in FIG. 5 of the tool 10 is shown along line 5—5 as shown in FIG. 3. As seen in FIG. 5, the groove 12 does not extend through the tool 10, but rather extends only partially through the cross-section of the tool 10. The length of the groove is preferably approximately 0.025 inches while the preferred depth is approximately 0.008 inches and the preferred width is approximately 0.001 inches.

An end view of the preferred embodiment of the masking tool 10 is shown in FIG. 6. As shown there, the end 16 is substantially flat with the groove 12 extending through the end 16. In the preferred embodiment, the end 16 is polished to prevent buildup of debris from the bonding process as well as provide consistent pressure to the leads 20. In the preferred embodiment, the dimensions of the end 16 are 0.005 inches along the face side 14 with the adjacent sides being approximately 0.010 inches long. The preferred width of the groove 12 as shown in FIG. 6 is 0.001 inches.

An alternate embodiment of the tool 10 provided to reflect a laser beam away from the substrate 12 could include a combination of two surfaces 21, 22 formed into the face 14 as depicted in FIG. 9. In that embodiment, the surfaces 21, 22 are designed to reflect the energy striking them away from the tool 10 and the substrate 40.

In another alternate embodiment, the face 14 can be formed without depressions as depicted in FIG. 10. In that embodiment, the face 14 of the tool 10 is preferably finished with a rough surface to randomly scatter those portions of the laser beam which strike the face 14 of the masking tool 10. The surface 14 is mechanically abraded to produce the desired finish, although it will be understood that the finish could also be produced by other methods as well as by a material applied to the face 14. The random scattering of the beam 50 by the face 14 would avoid any damage to the circuit board or related electrical components by reflections of the beam off of the tool 10. Alternately, the face 14 could be finished with a surface or material which absorbs substantially all of the energy directed at the face 14. In that way, any damage due to beam reflections would also be avoided.

Alternate embodiments of the masking tool 10 are shown in FIGS. 7 and 8. In FIG. 7, the slot 13 shown in the face 14 and end 16 is formed in the masking tool 10 in place of the groove 12 as shown in FIGS. 3, 5 and 6. The slot 13 is preferably formed through the face 14 of the masking tool through the back 15 of the tool as shown in FIG. 7. In all other aspects, the masking tool 10 would remain the same as the preferred embodiment and would be used in the same manner.

In FIG. 8 an additional alternate embodiment of the masking tool 10 is shown. The enlarged view of the end 16 of the tool 10 shows a notch 17 formed in the end 16. The notch 17 is adapted to cooperate with leads (not shown) to align them under the masking tool 10 by fitting the notch around the leads. The end 16 could alternately be formed in a variety of shapes to aid in aligning the leads, including, but not limited to, a concave end portion. Such alignment would help assure the masking and bonding processes would be completed with the leads being located in the proper position on the bonding pads 30 and in the proper position relative to the masking tool 10.

In the preferred embodiment, the masking tool 10 is preferably formed of tungsten carbide. However, high-temp tungsten may also be used and those skilled in the art will recognize that many other materials, including metals, ceramics, plastics, etc., can be used to form the tool. The masking tool 10 of the preferred embodiment is a modified version of the Model 30 ABT Style Slim-line Back Autobonding Tool ® offered by Small Precision Tools, Petaluma, Calif. The grooves and other features described for the preferred embodiments of the tool 10 are formed using Electric Discharge Machining (EDM). It will be appreciated by those skilled in the art that many other machining and forming methods could also be used.

Preferred Method

As depicted in FIG. 1, the preferred method of masking during laser bonding includes the steps of bringing the masking tool 10 into contact with the lead 20, which, in turn, brings the lead 20 into contact with the bonding pad 30 located on the circuit board 40. Once the lead 20 is in place, the energy beam source, which is preferably a Neodymium-Yttrium-Aluminum Oxide Garnet (Nd-Yag) laser, is fired into the groove 12 to strike lead 20 as shown by beam 50. The beam 50 is preferably directed at the bonding area at an angle 60° off of the longitudinal axis of the tool 10. The resulting laser beam spot 52 strikes both the masking tool 10 and lead 20 although its outer portions are limited to striking the masking tool face 14.

By directing the laser beam 50 into the groove 12 formed in the masking tool 10 the circuit board 40 is protected from receiving fringe or misdirected laser energy which could damage the board 40. FIG. 1 does, in fact, show a partially misaligned beam 50 striking the tool 10 to the left of its center, which illustrates the masking function of the tool 10. Although masking a portion of the beam 50 reduces the amount of energy available for bonding, the width and depth of the masking tool groove 12, beam power and dwell time can be adjusted to allow a sufficient amount of energy to strike the lead 20 and bond it to the bonding pad 30.

The preferred method includes the use of a tool 10 which has depressions 18, 19 constructed in it to reflect substantially all of the beam in a direction away from the board 40 or chip 60. The surface of the depressions 18, 19 is preferably left in the matte finish which naturally results from the EDM process used to form them. That finish reflects a large portion of the beam 50 and the shape of the depressions 18, 19 directs those reflections away from the bonding area to prevent damage.

Figure 2:
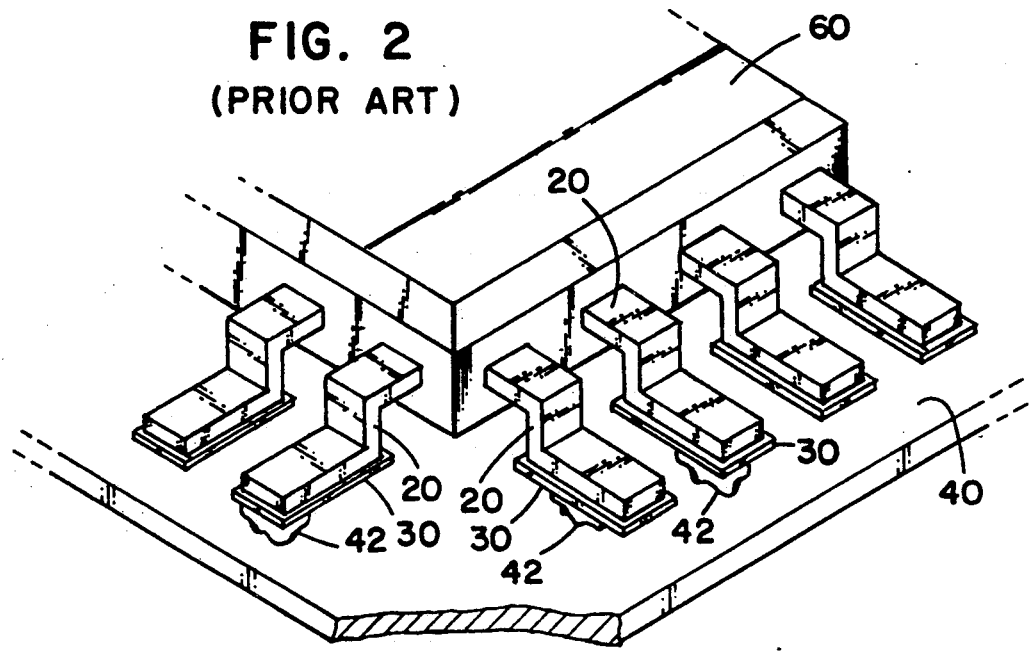
FIG. 2 is a perspective view of an integrated circuit device and its leads on a circuit board with damage shown to the circuit board substrate.

FIG. 2 shows the problems associated with laser bonding which does not employ masking. As shown, the circuit board 40 could suffer damaged areas 42 around the bonding pads 30 if the laser beam is either misdirected or if the fringe energy of the beam is allowed to strike the circuit board 40 during bonding of the leads 20 to the bonding pads 30. The damaged areas 42 could cause failures of the board, integrated circuit chips and associated electrical components located on or in the board 40. It will be appreciated by those skilled in the art that similar damage could occur if a laser was used to perform inner lead bonding, flex bonding or any other type of laser bonding as well as the process described in detail herein.

Also in the preferred method, the lead 20 and bonding pad 30 are formed of any suitable material having a tin plating to absorb sufficient energy to allow sufficient bonding to occur between the lead 20 and bonding pad 30 without the addition of flux. The bonding pad is preferably formed with a top layer comprised primarily of solder to aid in bonding to the tin-plated lead. Those skilled in the art will recognize that other materials could be substituted, provided they absorbed sufficient energy to perform the bonding process.

In the preferred method, the Nd-Yag laser is preferably fired for approximately 100 milliseconds with a spot size 0.0016" in diameter plus fringe energy. The Nd-Yag laser is preferably run in a continuous wave mode and the energy directed at the bonding area is preferably approximately 1.5 watts. It will be recognized by those skilled in the art that a variety of lasers, including carbon dioxide, ruby, excimer and others, could be used to perform the laser bonding as well as a pulsed laser in place of a continuous wave model. In addition, those skilled in the art will recognize that the energy needed to perform the bonding process could be directed to the bonding area by a number of devices capable of producing directed energy beams including, but not limited to, an electron beam generator.

In an alternate preferred method, the tool 10 is connected to a heat source 11 (shown in FIG. 4), such as a coiled resistance heater, to heat the bonding area prior to and during the lasing process. The addition of heat to the bonding tool 10 can enhance the bonding process as well as reduce the laser energy required to perform the bonding. The reduction in laser energy required can allow the use of a lower power beam and/or a shorter dwell period for the beam which would speed processing. In an additional alternate preferred method, the beam 50 itself can be used to add heat energy to the lead 20 and bonding pad 30.

In another preferred method, the masking tool 10 can perform a heat sinking function which draws heat generated during the bonding process away from the leads 20 and bonding pads 30. The heat sinking function prevents damage to the integrated circuit chip 60 as well as any other electrical components which may be connected to the bonding pad 30 or lead 40.

An alternate embodiment of both the tool and method is illustrated in FIG. 11. As shown there, the tool 70 includes a plurality of grooves 72 adapted to mask a plurality of leads and bonding areas while allowing a beam of energy (not shown) to be scanned across the tool 70 to bond the leads 76 and bonding areas 78. It will be appreciated by those skilled in the art that the beam could either be scanned in a continuous mode or the optics could be adjusted to fire into the grooves in a sequential manner. Likewise many of the features of the alternate embodiments and method described above could be incorporated into this embodiment of the present invention, as desired.

Figure 12:
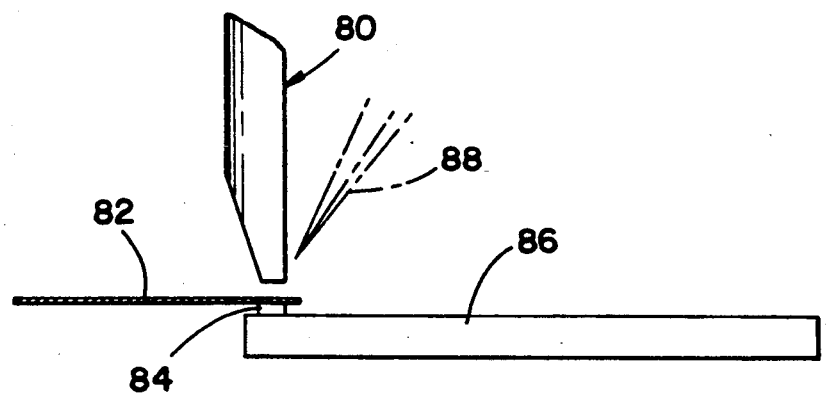
FIG. 12 is a side view of an inner lead bonding process according to the present invention.

FIG. 12 depicts an inner lead bonding embodiment of the present apparatus and method. In that method the masking tool 80 is brought down onto an inner lead 82 which is lying on a bonding area 84 located on a component 86. As in the preferred method, the beam 88 is fired to strike the tool 80 as well as the lead 82 and bonding area 84, while protecting the component 86. The method and apparatus used in inner lead bonding are similar to those used in outer lead bonding as described in detail above, with variations in processing parameters made as required. In addition, a plurality of inner lead bonds could also be bonded using one masking tool as described with respect to FIG. 11.

Figure 13:
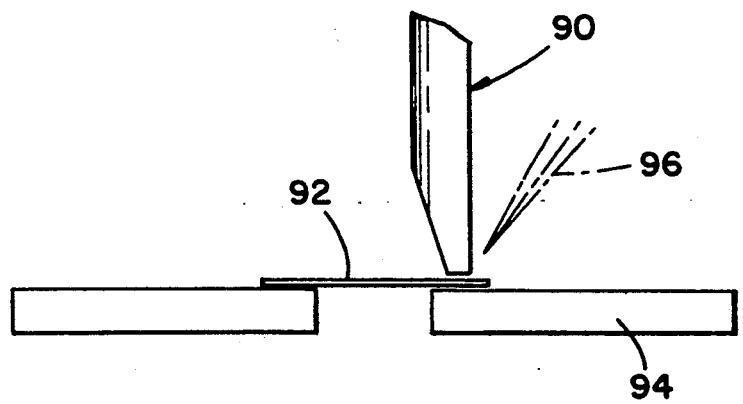
FIG. 13 is a side view of a flex circuit bonding process according to the present invention.

FIG. 13 depicts yet another embodiment of the present apparatus and method in which a flex circuit 92 is bonded using a laser masking tool 90. The tool 90 is brought down into contact with the flex circuit 92 which in turn contacts the bonding area on a substrate 94. As in the preferred method, the beam 96 is fired to strike the tool 90 as well as the flex circuit 92, while protecting the substrate 94. The method and apparatus used in flex circuit bonding are similar to those used in outer lead bonding as described in detail above, with variations in processing parameters such as tool size and laser power, among others, as required. In addition, a plurality of flex circuit bonds can be bonded using one masking tool as described with respect to FIG. 11.

Additional alternate preferred methods could include the use of the alternate preferred embodiments of the tool described above including, but not limited to, absorbing the beam energy striking the tool, reflecting the beam in a random manner, reflecting the beam with a tool having a substantially flat face, reflecting the beam away from the bonding area with a tool having angular faces formed in it, aligning the leads under the tool using a groove, and substituting a slot in place of the groove to mask the beam.

Although specific embodiments have been illustrated and described herein, it will be appreciated by those of ordinary skill in the art that any arrangement which is calculated to achieve the same purpose may be substituted for the specific embodiments shown. For example, the present invention disclosed herein may be implemented with different shaped tools. In addition, the tool could be formed of a variety of materials and in a variety of shapes providing the masking process to protect the circuit board is accomplished. Thus, it is manifestly intended that this invention be limited only by the claims and the equivalence thereof.

We claim:

1. A masking tool for masking a substrate from energy directed at electrical conductors to bond the conductors to bonding surfaces located on the substrate, the masking tool comprising;
   holding means for holding at least one electrical conductor stationary against a bonding surface, said holding means having an end adapted for holding at least one electrical conductor stationary against a bonding surface; and a slot formed through the masking tool, the slot originating from the holding means end, the slot also adapted to cooperate with the directed energy to allow a sufficient amount of the directed energy to reach the masked electrical conductor to bond it with the bonding surface while protecting the substrate from the directed energy.

2. The masking tool of claim 1, wherein the slot originates proximate a midpoint of the width of the holding means end when the tool is designed to bond one electrical conductor.

3. The masking tool of claim 1, wherein the bonding tool reflects substantially all of the directed energy striking it.

4. The masking tool of claim 3, wherein the directed energy is reflected in a randomly scattered manner.

5. The masking tool of claim 3, wherein the masking tool reflects the directed energy away from the substrate.

6. The masking tool of claim 1, wherein the masking tool absorbs substantially all of the directed energy striking it.

7. A method of masking a substrate from energy directed at electrical conductors and bonding surfaces located on the substrate to bond the electrical conductors and bonding surfaces together, the method comprising the steps of:
   (a) placing at least one electrical conductor on a bonding surface;
   (b) aligning each electrical conductor on a bonding surface with the masking tool;
   (c) holding each electrical conductor stationary and in contact with a bonding surface;
   (d) masking the substrate from the energy directed at each electrical conductor and bonding surface with the masking tool;
   (e) directing energy at each electrical conductor, bonding surface and masking tool for a sufficient period of time to bond each conductor and bonding surface; and
   (f) removing the masking tool from contact with each electrical conductor.

8. The method of claim 7, wherein the directed energy is supplied by a laser.

9. The method of claim 8, wherein the laser comprises a Neodymium-Yttrium-Aluminum Oxide Garnet (Nd-Yag) lasing source.

10. The method of claim 7, wherein the aligning of each electrical conductor is accomplished by a notch formed in an end of the masking tool, each notch cooperating with an electrical conductor.

11. The method of claim 7, wherein the masking is accomplished by reflecting the directed energy striking the masking tool away from the masking tool.

12. The method of claim 11, wherein the directed energy is reflected in a substantially random scattered manner.

13. The method of claim 11, wherein the directed energy is also reflected away from the substrate.

14. The method of claim 7, wherein the masking is accomplished by absorbing substantially all of the directed energy striking the masking tool.

15. The method of claim 7, further comprising the step of heat sinking the electrical conductors and bonding surfaces by providing a masking tool with sufficient heat conduction capabilities to conduct heat away from the electrical conductors and bonding surfaces.

16. The method of claim 8, further comprising the step of supplying heat energy to the electrical conductors and bonding surfaces by heating the masking tool.

17. The method of claim 16, wherein the heat is supplied by the directed energy striking the masking tool.

18. The method of claim 16, wherein the heat is supplied by an external heat source thermally connected to the masking tool.

19. The method of claim 7, further wherein the directed energy is scanned across the masking tool to perform the bonding process at a plurality of electrical conductors and bonding surfaces.

20. The method of claim 7, further wherein the directed energy is directed at each individual electrical conductor and bonding surface in a substantially sequential manner.

21. A method of masking a substrate from energy directed at electrical conductors and bonding surfaces located on the substrate to bond the electrical conductors and bonding surfaces together, the method comprising the steps of:
   (a) placing at least one electrical conductor on a bonding surface;
   (b) holding each electrical conductor stationary and in contact with a bonding surface;
   (c) masking the substrate from the energy directed at each electrical conductor and bonding surface with the masking tool by directing the energy at masking means in the masking tool, the masking means allowing a sufficient amount of the energy to reach an electrical conductor while masking the substrate from the directed energy striking the masking tool, the masking means being chosen from the group consisting of a groove formed in the masking tool and a slot formed in the masking tool;
   (d) directing energy at each electrical conductor, bonding surface and masking tool for a sufficient period of time to bond each conductor and bonding surface; and
   (e) removing the masking tool from contact with each electrical conductor.

22. The method of claim 21, wherein the directed energy is supplied by a laser.

23. The method of claim 22, wherein the laser comprises a Neodymium-Yttrium-aluminum Oxide Garnet (Nd-Yag) lasing source.

24. The method of claim 21, wherein the masking is accomplished by reflecting the directed energy striking the masking tool away from the masking tool.

25. The method of claim 24, wherein the directed energy is reflected in a substantially random scattered manner.

26. The method of claim 24, wherein the directed energy is also reflected away from the substrate.

27. The method of claim 24, wherein the masking is accomplished by absorbing substantially all of the directed energy striking the masking tool.

28. The method of claim 21, further comprising the step of heat sinking the electrical conductors and bonding surfaces by providing a masking tool with sufficient heat conduction capabilities to conduct heat away from the electrical conductors and bonding surfaces.

29. The method of claim 21, further comprising the step of supplying heat energy to the electrical conductors and bonding surfaces by heating the masking tool.

30. The method of claim 29, wherein the heat is supplied by the directed energy striking the masking tool.

31. The method of claim 29, wherein the heat is supplied by an external heat source thermally connected to the masking tool.

32. The method of claim 21, further wherein the directed energy is scanned across the masking tool to perform the bonding process at a plurality of electrical conductors and bonding surfaces.

33. The method of claim 21, further wherein the directed energy is directed at each individual electrical conductor and bonding surface in a substantially sequential manner.

* * * * *

UNITED STATES PATENT AND TRADEMARK OFFICE
CERTIFICATE OF CORRECTION

PATENT NO. : 5,194,710

DATED : March 16, 1993

INVENTOR(S) : Kent T. McDaniel et al.

It is certified that error appears in the above-identified patent and that said Letters Patent is hereby corrected as shown below:

In column 2, line 25, insert --as-- after the word "well" therefore.

In column 4, line 5, "perform" should read --performing-- therefore.

In column 11, line 2 (claim 23), "aluminum" should read --Aluminum-- therefore.

Signed and Sealed this

Eighth Day of February, 1994

Attest:

BRUCE LEHMAN

Attesting Officer     Commissioner of Patents and Trademarks